(12) United States Patent
Kobayashi et al.

(10) Patent No.: US 11,935,767 B2
(45) Date of Patent: Mar. 19, 2024

(54) TEMPERATURE CONTROL DEVICE

(71) Applicant: KELK Ltd., Kanagawa (JP)

(72) Inventors: Atsushi Kobayashi, Kanagawa (JP); Masato Horikoshi, Kanagawa (JP); Hideaki Ohkubo, Kanagawa (JP); Wataru Kiyosawa, Kanagawa (JP)

(73) Assignee: Kelk Ltd., Kanagawa (JP)

( * ) Notice: Subject to any disclaimer, the term of this patent is extended or adjusted under 35 U.S.C. 154(b) by 216 days.

(21) Appl. No.: 17/282,948

(22) PCT Filed: Oct. 30, 2019

(86) PCT No.: PCT/JP2019/042612
§ 371 (c)(1),
(2) Date: Apr. 5, 2021

(87) PCT Pub. No.: WO2020/095795
PCT Pub. Date: May 14, 2020

(65) Prior Publication Data
US 2021/0391192 A1 Dec. 16, 2021

(30) Foreign Application Priority Data
Nov. 9, 2018 (JP) ................................. 2018-211418

(51) Int. Cl.
*H01L 21/67* (2006.01)
*H01L 21/687* (2006.01)

(52) U.S. Cl.
CPC .. *H01L 21/67103* (2013.01); *H01L 21/68785* (2013.01)

(58) Field of Classification Search
CPC .......... H01L 21/3065; H01L 21/67103; H01L 21/67109; H01L 21/6719; H01L 21/67248;
(Continued)

(56) References Cited

U.S. PATENT DOCUMENTS 6,104,203 A * 8/2000 Costello ............. G01R 31/2849
324/756.07
6,347,521 B1 2/2002 Kadotani et al.
(Continued)

FOREIGN PATENT DOCUMENTS

CN 1171634 A 1/1998
JP 2002353298 12/2002
(Continued)

OTHER PUBLICATIONS

Taiwanese Office Action in corresponding Chinese Appln. No. 108140056, dated Jun. 29, 2021, 5 pages.

*Primary Examiner* — Sang Y Paik
(74) *Attorney, Agent, or Firm* — Fish & Richardson P.C.

(57) ABSTRACT

A temperature control device includes: a top plate that supports a substrate; a base plate connected to the top plate so as to form an internal space with the top plate; a thermoelectric module plate arranged in the internal space; a heat exchange plate that is arranged in the internal space and exchanges heat with the thermoelectric module plate; a first coupling member that couples the top plate and the base plate via the thermoelectric module plate and the heat exchange plate and is fixed to each of the top plate and the base plate; and a second coupling member that couples the top plate and the base plate via the thermoelectric module plate and the heat exchange plate, is fixed to the top plate, and is movable relative to the base plate.

14 Claims, 8 Drawing Sheets

(58) Field of Classification Search
CPC ... H01L 21/68785; H10N 10/13; H10N 10/17
USPC ........................................................ 219/444.1
See application file for complete search history.

(56) References Cited

U.S. PATENT DOCUMENTS

| | | | |
|---|---|---|---|
| 6,886,347 B2* | 5/2005 | Hudson | H01L 21/67109 62/3.3 |
| 10,879,053 B2 | 12/2020 | Ricci et al. | |
| 2002/0066551 A1 | 6/2002 | Stone et al. | |
| 2002/0074646 A1* | 6/2002 | Saika | H01L 23/38 257/E23.102 |
| 2004/0107704 A1* | 6/2004 | Hudson | H01L 21/67109 62/3.3 |
| 2006/0279899 A1* | 12/2006 | Aihara | H01L 21/6831 361/234 |
| 2007/0283709 A1 | 12/2007 | Luse et al. | |
| 2011/0297321 A1 | 12/2011 | Matsuda et al. | |
| 2014/0356985 A1 | 12/2014 | Ricci et al. | |
| 2017/0110298 A1 | 4/2017 | Ricci et al. | |
| 2019/0189491 A1 | 6/2019 | Akatsuka | |

FOREIGN PATENT DOCUMENTS

| | | |
|---|---|---|
| JP | 2003508893 A | 3/2003 |
| JP | 20038508893 | 3/2003 |
| JP | 2004104113 A | 4/2004 |
| JP | 2007-123911 A | 5/2007 |
| JP | 2009540580 A | 11/2009 |
| JP | 2010168635 A | 8/2010 |
| JP | 2013055089 | 3/2013 |
| JP | 2015008287 | 1/2015 |
| KR | 20140142177 A | 12/2014 |
| TW | 201511174 | 3/2015 |
| TW | 201820528 | 6/2018 |
| TW | 108140056 | 11/2019 |
| WO | WO2018038044 | 3/2018 |

* cited by examiner

TEMPERATURE CONTROL DEVICE

CROSS-REFERENCE TO RELATED APPLICATIONS

This application is a National Stage application of International Application No. PCT/JP2019/042612, filed on Oct. 30, 2019, which claims priority to Japanese Patent Application No. 2018-211418, filed on Nov. 9, 2018. The contents of the prior applications are incorporated herein in their entirety.

FIELD

The present invention relates to a temperature control device.

BACKGROUND

In a process of manufacturing semiconductor devices, various semiconductor processing apparatuses, such as a film deposition apparatus that performs a film deposition process on the substrate, an exposure apparatus that performs an exposure process of the substrate, and an etching apparatus that performs an etching process of the substrate, are used. The semiconductor processing apparatus is provided with a temperature control device that adjusts the temperature of the substrate in many cases. For example, when a dry etching process is performed on a substrate, an etching rate is affected by the temperature of the substrate so that the dry etching process is performed while adjusting the temperature of the substrate by the temperature control device. Patent Literature 1 discloses a substrate support assembly that adjusts the temperature of a substrate in a vacuum chamber of a semiconductor processing apparatus. In Patent Literature 1, the substrate support assembly functions as a temperature control device. The substrate support assembly has a top plate that supports the substrate, a base plate arranged below the top plate, and a cover plate arranged between the top plate and the base plate. A thermoelectric module is arranged in an internal space between the cover plate and the base plate. The thermoelectric module is joined to the cover plate.

CITATION LIST

Patent Literature

Patent Literature 1: JP 2015-008287 A

SUMMARY

Technical Problem

When the temperature control device is used in a high-temperature environment, there is a possibility that excessive stress may act on at least one of the thermoelectric module and a member adjacent to the thermoelectric module due to thermal deformation of at least one of the thermoelectric module and the member. As a result, there is a possibility that at least a part of the temperature control device may be damaged and the performance of the temperature control device may deteriorate.

An aspect of the present invention aims to suppress deterioration of performance of a temperature control device even if at least a part of the temperature control device is thermally deformed.

Solution to Problem

According to an aspect of the present invention, a temperature control device comprises: a top plate that supports a substrate; a base plate connected to the top plate so as to form an internal space with the top plate; a thermoelectric module plate arranged in the internal space; a heat exchange plate that is arranged in the internal space and exchanges heat with the thermoelectric module plate; a first coupling member that couples the top plate and the base plate via the thermoelectric module plate and the heat exchange plate and is fixed to each of the top plate and the base plate; and a second coupling member that couples the top plate and the base plate via the thermoelectric module plate and the heat exchange plate, is fixed to the top plate, and is movable relative to the base plate.

Advantageous Effects of Invention

According to an aspect of the present invention, it is possible to suppress the deterioration of performance of the temperature control device even if at least a part of the temperature control device is thermally deformed.

DESCRIPTION OF EMBODIMENTS

Hereinafter, embodiments of the present invention will be described with reference to the drawings, but the present invention is not limited thereto. Components of the embodiments to be described below can be combined as appropriate. In addition, there is also a case where some components are not used.

In the following description, an XYZ orthogonal coordinate system is set, and positional relations of the respective portions will be described with reference to this XYZ orthogonal coordinate system. A direction parallel to an X axis in a predetermined plane is defined as an X-axis direction. A direction parallel to a Y axis orthogonal to the X axis in the predetermined plane is defined as a Y-axis direction. A direction parallel to a Z axis orthogonal to the predetermined plane is defined as a Z-axis direction. An XY plane including the X axis and Y axis is parallel to the predetermined plane. A YZ plane including the Y axis and Z axis is orthogonal to the XY plane. An XZ plane including the X axis and Z axis is orthogonal to each of the XY plane and YZ plane. In the present embodiment, the XY plane is parallel to the horizontal plane. The Z-axis direction is the vertical direction. The +Z direction (+Z side) is the upward direction (upper side). The −Z direction (−Z side) is the downward direction (lower side). Note that the XY plane may be inclined with respect to the horizontal plane.

Semiconductor Processing Apparatus

Figure 1:
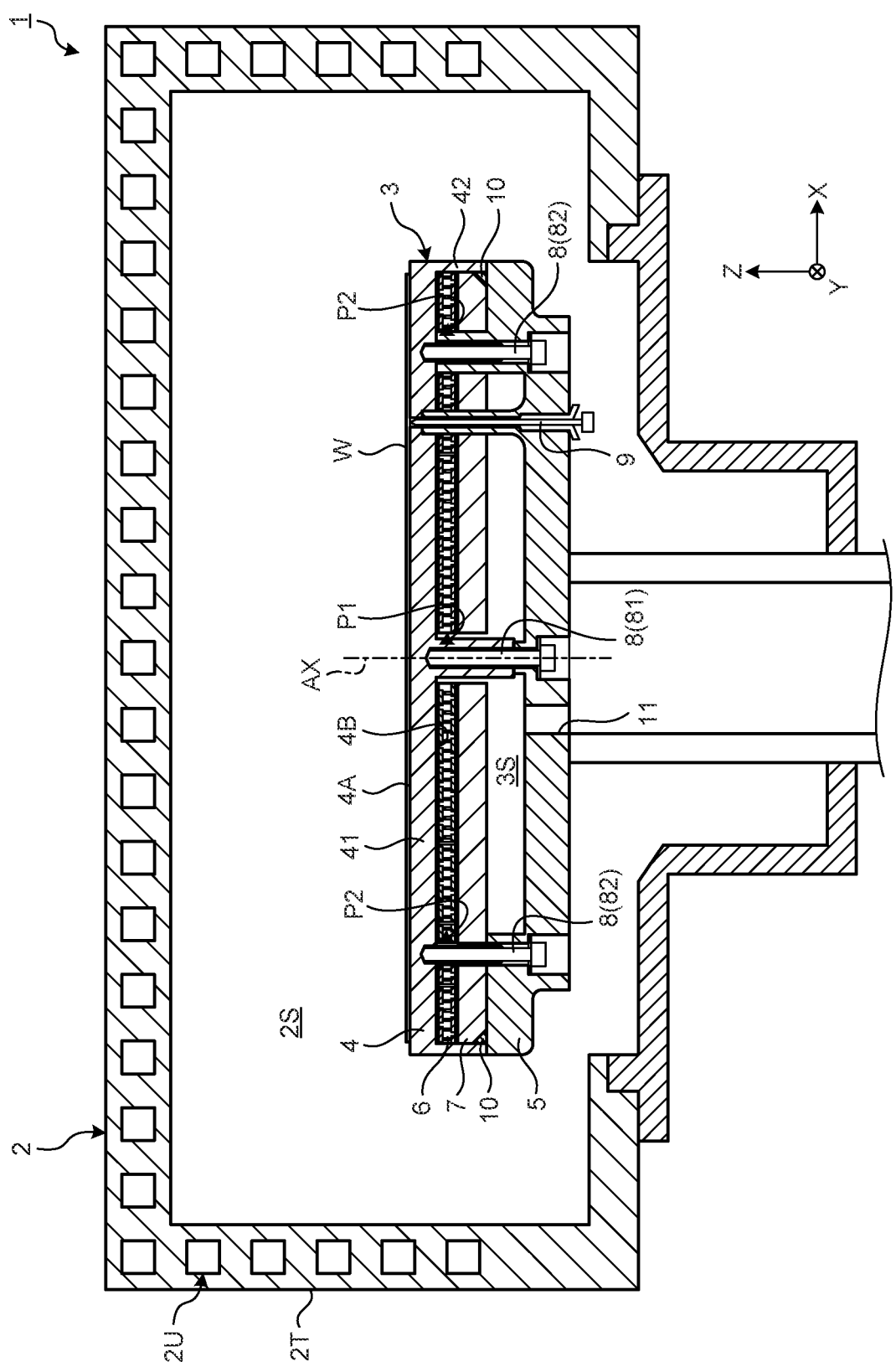
FIG. 1 is a cross-sectional view schematically illustrating an example of a semiconductor processing apparatus according to the present embodiment.

FIG. 1 is a cross-sectional view schematically illustrating an example of a semiconductor processing apparatus 1 according to the present embodiment. As illustrated in FIG. 1, the semiconductor processing apparatus 1 includes a chamber device 2 and a temperature control device 3 that is arranged in an internal space 2S of the chamber device 2 and adjusts the temperature of a substrate W in the internal space 2S.

In the present embodiment, the semiconductor processing apparatus 1 includes a dry etching device that performs a dry etching process on the substrate W. The substrate W includes a semiconductor wafer. In the dry etching process, the pressure in the internal space 2S of the chamber device 2 is adjusted to a pressure lower than atmospheric pressure. The pressure in the internal space 2S is adjusted to be, for example, 200 [Pa]. In the try etching process, the temperature of the substrate W is adjusted by the temperature control device 3. An etching gas is supplied to the internal space 2S of the chamber device 2 in a state where the internal space 2S of the chamber device 2 is depressurized and the temperature of the substrate W is adjusted. As the etching gas is supplied to the internal space 2S, the substrate W is dry-etched.

The temperature control device 3 adjusts the temperature of the substrate W in a state of supporting the substrate W. The temperature control device 3 can adjust an etching rate by adjusting the temperature of the substrate W. In addition, the temperature control device 3 can adjust the temperature distribution of the substrate W.

The chamber device 2 has a chamber member 2T forming the internal space 2S and a temperature adjustment device 2U that adjusts the temperature of the chamber member 2T. When the chamber member 2T is heated by the temperature adjustment device 2U, there is a possibility that the temperature of the substrate W supported by the temperature control device 3 becomes excessively higher than a target temperature, or the temperature distribution of the substrate W does not reach a target temperature distribution. The temperature control device 3 adjusts the temperature of the substrate W such that the substrate W reaches the target temperature even when the chamber member 2T is heated. The temperature control device 3 adjusts the temperature distribution of the substrate W such that the substrate W has the target temperature distribution even when the chamber member 2T is heated.

Temperature Control Device

Figure 2:
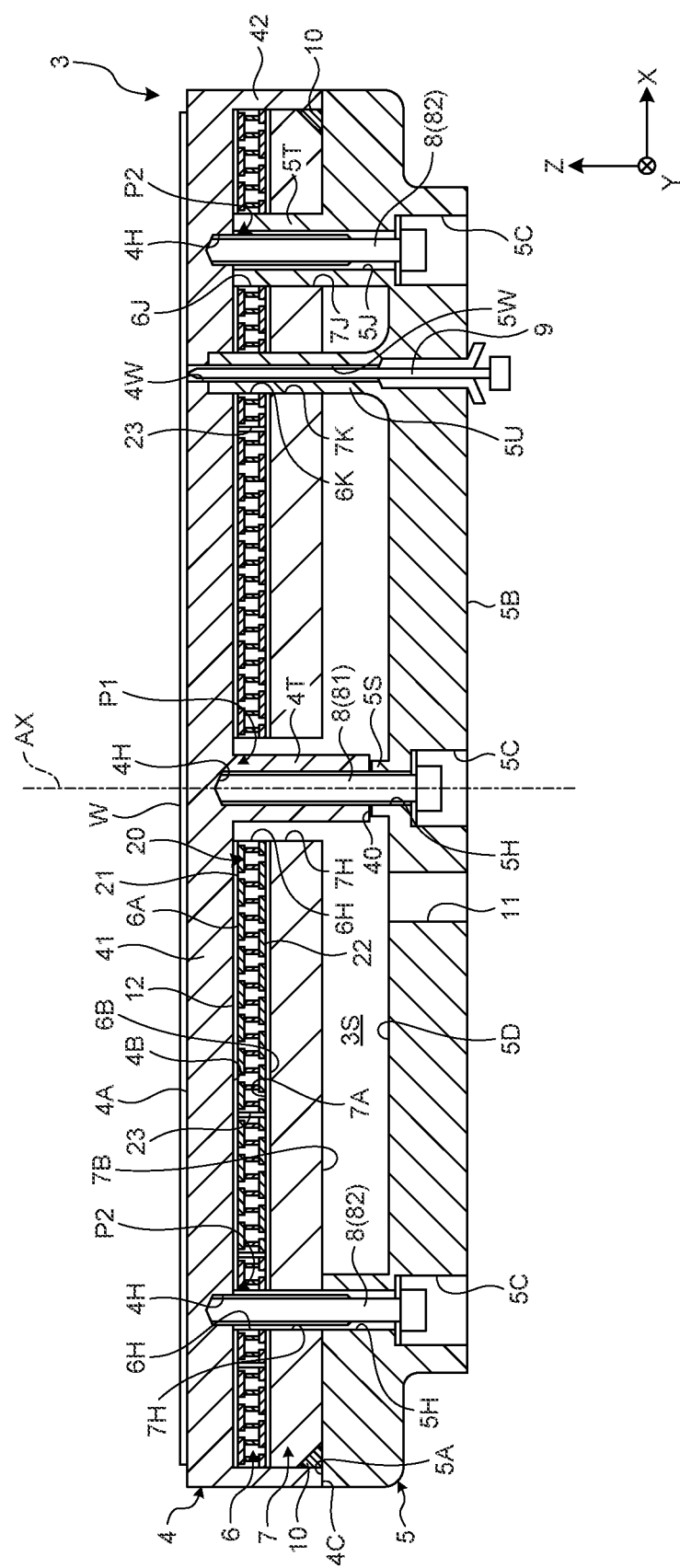
FIG. 2 is a cross-sectional view schematically illustrating an example of a temperature control device according to the present embodiment.
Figure 3:
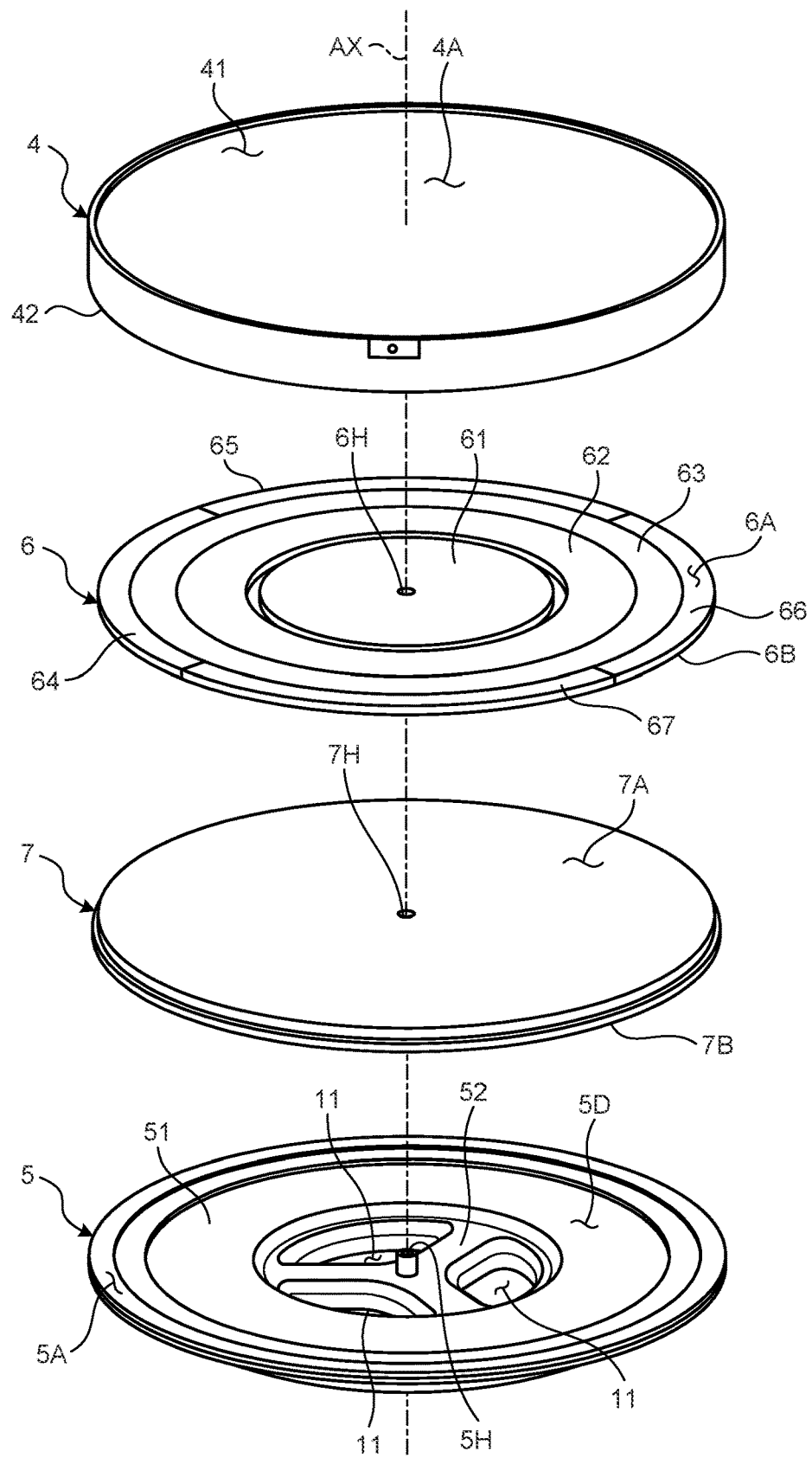
FIG. 3 is an exploded perspective view illustrating an example of the temperature control device according to the present embodiment.

FIG. 2 is a cross-sectional view schematically illustrating an example of the temperature control device 3 according to the present embodiment. FIG. 3 is an exploded perspective view illustrating an example of the temperature control device 3 according to the present embodiment.

As illustrated in FIGS. 1, 2, and 3, the temperature control device 3 includes: a top plate 4 that supports the substrate W; a base plate 5 connected to the top plate 4 so as to form an internal space 3S with the top plate 4; a thermoelectric module plate 6 arranged in the internal space 3S; a heat exchange plate 7 that is arranged in the internal space 3S and exchanges heat with the thermoelectric module plate 6; a coupling member 8 coupling the top plate 4 and the base plate 5; a lift pin 9 that supports a back surface of the substrate W to move the substrate W in the Z-axis direction; and a sealing member 10 that comes into contact with each of the top plate 4 and the base plate 5.

Each of the top plate 4, the thermoelectric module plate 6, the heat exchange plate 7, and the base plate 5 has a substantially disk shape. The top plate 4, the thermoelectric module plate 6, the heat exchange plate 7, and the base plate 5 are stacked in the Z-axis direction. In the following description, a virtual axis, which passes through the center of the temperature control device 3 in the XY plane and is parallel to the Z axis, is appropriately referred to as a central axis AX of the temperature control device 3.

The top plate 4 has a support surface 4A that supports the substrate W. The top plate 4 is made of, for example, aluminum. The top plate 4 may be made of stainless steel. The support surface 4A faces the +Z direction. The top plate 4 supports the substrate W such that the surface of the substrate W and the XY plane are parallel to each other. The substrate W is placed on the support surface 4A.

The top plate 4 has a disc-shaped support portion 41 having the support surface 4A and a back surface 4B facing the opposite direction of the support surface 4A, and a peripheral wall portion 42 which is connected to a peripheral edge portion of the support portion 41 and protrudes from the peripheral edge portion of the support portion 41 to the base plate 5.

The base plate 5 supports the top plate 4. The base plate 5 is made of, for example, aluminum. The base plate 5 may be made of stainless steel. The base plate 5 is arranged on the −Z side of the top plate 4, the thermoelectric module plate 6, and the heat exchange plate 7. The base plate 5 has an upper surface 5A facing a lower surface 4C of the peripheral wall portion 42 of the top plate 4, and an opposing surface 5D facing a lower surface 7B of the heat exchange plate 7 with a gap. Each of the upper surface 5A and the opposing surface 5D faces the +Z direction. The opposing surface 5D is arranged on the −Z side of the upper surface 5A. The upper surface 5A has an annular shape. In the XY plane, the upper surface 5A is arranged around the opposing surface 5D. The upper surface 5A comes into contact with the lower surface 4C of the peripheral wall portion 42. When the lower surface 4C of the peripheral wall portion 42 comes into contact with at least a part of the upper surface 5A of the base plate 5, the internal space 3S of the temperature control device 3 is formed between the top plate 4 and the base plate 5.

The base plate 5 has a convex portion 5T protruding from the opposing surface 5D to the support portion 41. At least a part of the convex portion 5T is arranged in a through hole 7J provided in the heat exchange plate 7. At least a part of the convex portion 5T is arranged in a through hole 6J provided in the thermoelectric module plate 6. An upper end of the convex portion 5T is connected to the support portion 41 of the top plate 4.

The base plate 5 has a convex portion 5U protruding from the opposing surface 5D to the support portion 41. In the radial direction of the central axis AX, the convex portion 5U is arranged between the central axis AX and the convex portion 5T. At least a part of the convex portion 5U is arranged in a through hole 7K provided in the heat exchange plate 7. At least a part of the convex portion 5U is arranged in a through hole 6K provided in the thermoelectric module plate 6. An upper end of the convex portion 5U is connected to the support portion 41 of the top plate 4.

The thermoelectric module plate 6 adjusts the temperature of the substrate W supported by the support surface 4A of the top plate 4. The thermoelectric module plate 6 includes a thermoelectric module 20 that absorbs heat or generates heat by supplying electric power. The thermoelectric module plate 6 is arranged in the internal space 3S. The thermoelectric module plate 6 is arranged on the −Z side of the support portion 41 of the top plate 4. The thermoelectric module plate 6 is arranged so as to be adjacent to the top plate 4 in the internal space 3S. An upper surface 6A of the thermoelectric module plate 6 faces the back surface 4B of the support portion 41.

The thermoelectric module 20 absorbs heat or generates heat by the Peltier effect. The thermoelectric module 20 can take heat from the substrate W supported by the support surface 4A via the support portion 41. The thermoelectric module 20 can apply heat to the substrate W supported by the support surface 4A via the support portion 41. As the thermoelectric module 20 absorbs heat or generates heat, the temperature of the substrate W supported by the support surface 4A is adjusted.

The thermoelectric module plate 6 includes the thermoelectric module 20, a first insulating film 21 connected to an upper surface of the thermoelectric module 20, a second insulating film 22 connected to a lower surface of the thermoelectric module 20, and a partition member 23 arranged around the thermoelectric module 20. The thermoelectric module 20 is arranged in a space defined by the first insulating film 21, the second insulating film 22, and the partition member 23. Each of the first insulating film 21 and the second insulating film 22 includes, for example, a film made of polyimide. The upper surface 6A of the thermoelectric module plate 6 includes an upper surface of the first insulating film 21. A lower surface 6B of the thermoelectric module plate 6 includes a lower surface of the second insulating film 22.

As illustrated in FIG. 3, the thermoelectric module plate 6 includes a first thermoelectric module plate 61, a second thermoelectric module plate 62, a third thermoelectric module plate 63, a fourth thermoelectric module plate 64, a fifth thermoelectric module plate 65, a sixth thermoelectric module plate 66, and a seventh thermoelectric module plate 67. The first thermoelectric module plate 61 is a circular plate arranged at the center in the XY plane. The central axis AX passes through the first thermoelectric module plate 61. The second thermoelectric module plate 62 is an annular plate arranged around the first thermoelectric module plate 61. The third thermoelectric module plate 63 is an annular plate arranged around the second thermoelectric module plate 62. The fourth thermoelectric module plate 64 is an arc-shaped plate arranged in a part around the third thermoelectric module plate 63. The fifth thermoelectric module plate 65 is an arc-shaped plate arranged next to the fourth thermoelectric module plate 64 in a part around the third thermoelectric module plate 63. The sixth thermoelectric module plate 66 is an arc-shaped plate arranged next to the fifth thermoelectric module plate 65 in a part around the third thermoelectric module plate 63. The seventh thermoelectric module plate 67 is an arc-shaped plate arranged between the fourth thermoelectric module plate 64 and the sixth thermoelectric module plate 66 in a part around the third thermoelectric module plate 63.

Each of the first to seventh thermoelectric module plates 61 to 67 has the thermoelectric module 20, the first insulating film 21, the second insulating film 22, and the partition member 23. Each of the first to seventh thermoelectric module plates 61 to 67 has the upper surface 6A and the lower surface 6B.

The heat exchange plate 7 exchanges heat with the thermoelectric module plate 6. The heat exchange plate 7 is arranged on the −Z side of the thermoelectric module plate 6 in the internal space 3S. In the Z-axis direction, the thermoelectric module plate 6 is arranged between the support portion 41 and the heat exchange plate 7. In the Z-axis direction, the heat exchange plate 7 is arranged between the thermoelectric module plate 6 and the base plate 5. The heat exchange plate 7 is arranged so as to be adjacent to the thermoelectric module plate 6 in the internal space 3S. An upper surface 7A of the heat exchange plate 7 faces the lower surface 6B of the thermoelectric module plate 6.

When the thermoelectric module 20 takes heat from the substrate W supported by the support surface 4A, the heat of the substrate W is transferred to the heat exchange plate 7 via the support portion 41 and the thermoelectric module plate 6. The heat exchange plate 7 has an internal flow path (not illustrated) through which a temperature control fluid flows. The temperature control fluid contains a refrigerant such as cooling water. The temperature control fluid is adjusted in temperature by a fluid temperature adjustment device (not illustrated), and then, flows into the internal flow path through an inlet of the internal flow path. The temperature control fluid flows through the internal flow path and takes heat transferred to the heat exchange plate 7. The temperature control fluid having taken the heat flows out from an outlet of the internal flow path and is returned to the fluid temperature adjustment device.

The heat exchange plate 7 is made of copper. The copper has a high thermal conductivity. Therefore, the heat exchange plate 7 can efficiently exchange heat with the thermoelectric module plate 6.

The coupling member 8 couples the top plate 4 and the base plate 5 via the thermoelectric module plate 6 and the heat exchange plate 7. A plurality of the coupling members 8 are provided. The coupling member 8 includes a bolt. The base plate 5 has a concave portion 5C in which a head of the coupling member 8 is arranged. The concave portion 5C is provided on a lower surface 5B of the base plate 5.

The base plate 5 has a through hole 5H in which at least a part of a shaft portion of the coupling member 8 is arranged. The heat exchange plate 7 has a through hole 7H in which at least a part of the shaft portion of the coupling member 8 is arranged. The thermoelectric module plate 6 has a through hole 6H in which at least a part of the shaft portion of the coupling member 8 is arranged. The top plate 4 has a screw hole 4H into which a distal end of the shaft portion of the coupling member 8 is inserted. The coupling member 8 couples the top plate 4 and the base plate 5 through the through hole 6H of the thermoelectric module plate 6 and the through hole 7H of the heat exchange plate 7.

The coupling members 8 include a first coupling member 81 to be coupled to a first part P1 of the top plate 4 and second coupling members 82 to be coupled to a plurality of second parts P2 of the top plate 4 defined around the first part P1. The first part P1 is defined in a central part of the support portion 41 of the top plate 4 in the XY plane. The plurality of second parts P2 are defined around the first part P1 of the support portion 41 of the top plate 4 in the XY plane. In the present embodiment, the second parts P2 are defined at six locations around the first part P1. The second parts P2 may be defined at least three places around the first part P1. The first coupling member 81 couples the first part P1 of the top plate 4 and the base plate 5 via the thermoelectric module plate 6 and the heat exchange plate 7. The second coupling members 82 couple the second parts P2 of the top plate 4 and the base plate 5 via the thermoelectric module plate 6 and the heat exchange plate 7.

Among the plurality of second coupling members 82, at least one second coupling member 82 is arranged in a through hole 5J provided in the convex portion 5T.

The top plate 4 has a convex portion 4T protruding from the back surface 4B to the base plate 5. The screw hole 4H into which the first coupling member 81 is inserted is provided in the convex portion 4T. The heat exchange plate 7 has the through hole 7H in which the first coupling member 81 and the convex portion 4T are arranged. The thermoelectric module plate 6 has the through hole 6H in which the first coupling member 81 and the convex portion 4T are arranged. A lower end surface of the convex portion 4T comes into contact with an upper end surface of the convex portion 5S provided on the base plate 5 with a heat insulator 40 interposed therebetween.

The lift pin 9 supports a back surface of the substrate W and moves the substrate W in the Z-axis direction such that the substrate W approaches or separates from the support surface 4A. At least a part of the lift pin 9 is arranged in a through hole 5W provided in the convex portion 5U. At least a part of the lift pin 9 is arranged in a through hole 4W provided in the top plate 4. A space inside the through hole 5W and a space inside the through hole 4W are connected to the internal space 2S of the chamber device 2.

The internal space 3S is open to the atmosphere. The internal space 3S is maintained at atmospheric pressure. The internal space 3S is connected to an external space (atmospheric space) of the chamber device 2 via a passage 11. At least a part of the passage 11 is provided in the base plate 5. As illustrated in FIG. 3, the base plate 5 has an annular rim portion 51 and a spoke portion 52 arranged on the inner side of the rim portion 51. The passage 11 is provided between the rim portion 51 and the spoke portion 52. The spoke portion 52 is provided with the through hole 5H in which the coupling member 8 to be coupled to the first part P1 of the top plate 4 is arranged.

The internal space 3S of the temperature control device 3 is maintained at atmospheric pressure. The internal space 2S of the chamber device 2 around the temperature control device 3 is maintained at a pressure lower than the atmospheric pressure. Since the pressure in the internal space 3S of the temperature control device 3 is higher than the pressure in the internal space 2S of the chamber device 2, the etching gas supplied to the internal space 2S of the chamber device 2 is suppressed from flowing into the internal space 3S of the temperature control device 3. As a result, contact between the etching gas and the thermoelectric module 20 is suppressed. For example, when the etching gas is corrosive, it is preferable that the etching gas not come into contact with the thermoelectric module 20. Since the pressure in the internal space 3S of the temperature control device 3 is higher than the pressure in the internal space 2S of the chamber device 2 in the present embodiment, the contact between the etching gas and the thermoelectric module 20 is suppressed.

The sealing member 10 comes into contact with each of the top plate 4 and the base plate 5. The sealing member 10 seals a boundary between the peripheral wall portion 42 of the top plate 4 and the base plate 5. Since the sealing member 10 is provided, the etching gas supplied to the internal space 2S of the chamber device 2 is suppressed from flowing into the internal space 3S of the temperature control device 3. In addition, a gas in the internal space 3S of the temperature control device 3 is suppressed from flowing out to the internal space 2S of the chamber device 2 since the sealing member 10 is provided. For example, foreign matter generated from at least one of the thermoelectric module plate 6 and the heat exchange plate 7 is suppressed from flowing out to the internal space 2S of the chamber device 2. As a result, the foreign matter is suppressed from adhering to the substrate W supported by the support surface 4A. In the present embodiment, the heat exchange plate 7 is made of copper. If foreign matter containing copper adheres to the substrate W, there is a possibility that the performance of a semiconductor device manufactured using the substrate W may deteriorate. Since the sealing member 10 is provided, the foreign matter generated in the internal space 3S of the temperature control device 3 is suppressed from adhering to the substrate W supported by the support surface 4A.

Thermoelectric Power Generation Module

Figure 4:
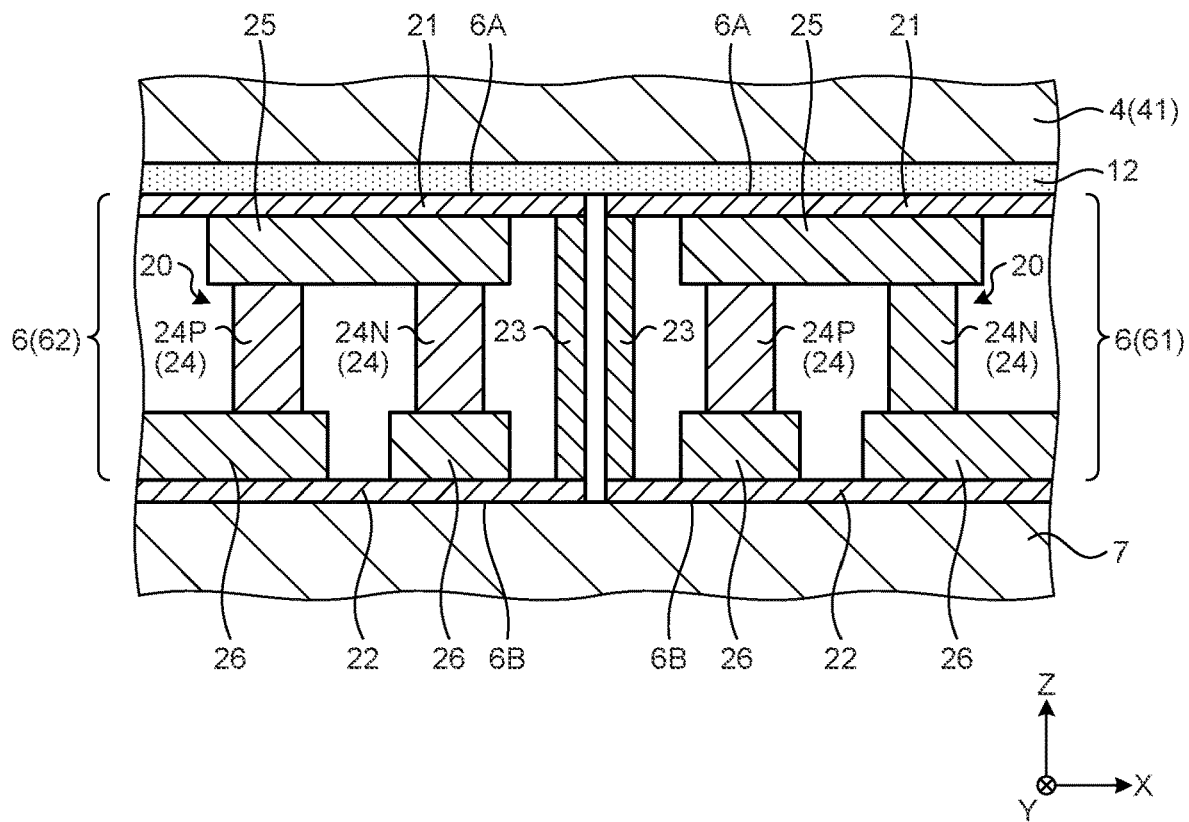
FIG. 4 is an enlarged cross-sectional view of a part of a thermoelectric module plate according to the present embodiment.
Figure 5:
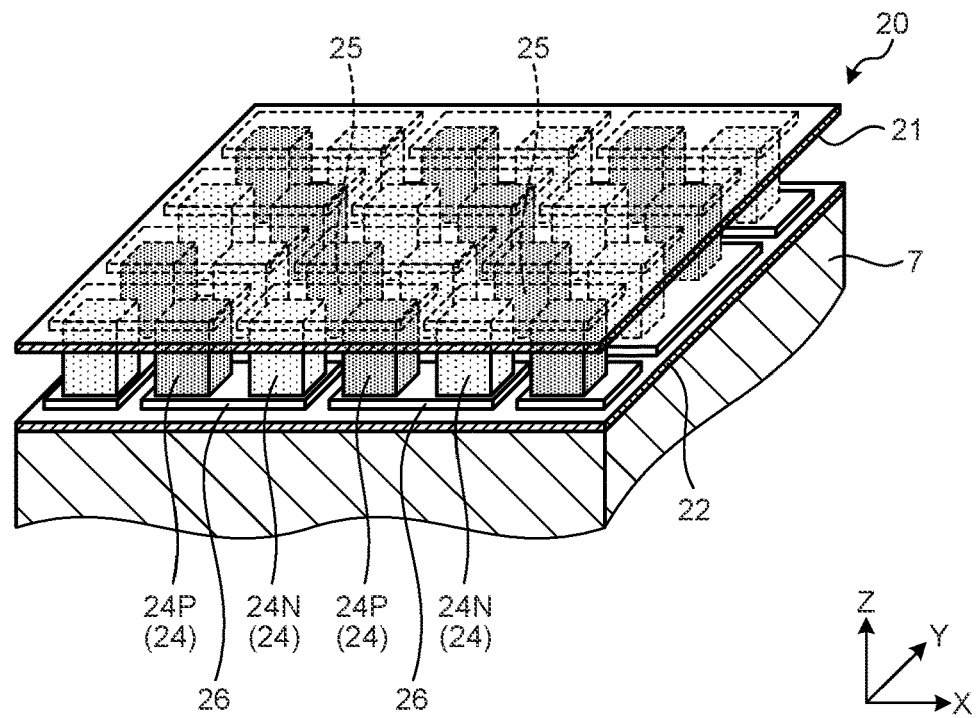
FIG. 5 is a perspective view illustrating a part of a thermoelectric power generation module according to the present embodiment.

FIG. 4 is an enlarged cross-sectional view of a part of the thermoelectric module plate 6 according to the present embodiment. FIG. 5 is a perspective view illustrating a part of the thermoelectric module plate 6 according to the present embodiment. Note that FIG. 4 is an enlarged cross-sectional view of a boundary between the first thermoelectric module plate 61 and the second thermoelectric module plate 62. A structure of each boundary among the second thermoelectric module plate 62 to the seventh thermoelectric module plate 67 is the same as a structure of the boundary between the first thermoelectric module plate 61 and the second thermoelectric module plate 62.

As illustrated in FIGS. 4 and 5, the thermoelectric module plate 6 includes the thermoelectric module 20, the first insulating film 21 connected to the upper surface of the thermoelectric module 20, the second insulating film 22 connected to the lower surface of the thermoelectric module 20, and the partition member 23 arranged around the thermoelectric module 20. The thermoelectric module 20 is arranged in a space defined by the first insulating film 21, the second insulating film 22, and the partition member 23. Each of the first insulating film 21 and the second insulating film 22 includes, for example, a film made of polyimide. The upper surface 6A of the thermoelectric module plate 6 includes an upper surface of the first insulating film 21. A lower surface 6B of the thermoelectric module plate 6 includes a lower surface of the second insulating film 22.

The partition member 23 is arranged between the first insulating film 21 and the second insulating film 22. The partition member 23 is an annular member provided so as to surround a space in which the thermoelectric module 20 is arranged. The partition member 23 is made of ceramics. The partition member 23 may be made of aluminum oxide or aluminum nitride. The partition member 23 is joined to each of the first insulating film 21 and the second insulating film 22 by an adhesive.

The thermoelectric module 20 has a thermoelectric semiconductor element 24, a first electrode 25, and a second electrode 26. The thermoelectric semiconductor element 24 includes a p-type thermoelectric semiconductor element 24P and an n-type thermoelectric semiconductor element 24N. In the XY plane, the p-type thermoelectric semiconductor element 24P and the n-type thermoelectric semiconductor element 24N are arranged alternately. The first electrode 25 is connected to each of the p-type thermoelectric semiconductor element 24P and the n-type thermoelectric semiconductor element 24N. The second electrode 26 is connected to each of the p-type thermoelectric semiconductor element 24P and the n-type thermoelectric semiconductor element 24N. An upper surface of the p-type thermoelectric semiconductor element 24P and an upper surface of the n-type thermoelectric semiconductor element 24N are connected to the first electrode 25. A lower surface of the p-type thermoelectric semiconductor element 24P and a lower surface of the n-type thermoelectric semiconductor element 24N are connected to the second electrode 26. The first electrode 25 is connected to the first insulating film 21. The second electrode 26 is connected to the second insulating film 22. The upper surface of the thermoelectric module 20 includes an upper surface of the first electrode 25. The lower surface of the thermoelectric module 20 includes a lower surface of the second electrode 26.

The thermoelectric module 20 absorbs heat or generates heat by the Peltier effect. When a potential difference is applied between the first electrode 25 and the second electrode 26, electric charges move in the thermoelectric semiconductor element 24. Due to the movement of electric charges, heat is transferred in the thermoelectric semiconductor element 24. As a result, the thermoelectric module 20 absorbs heat or generates heat. In the present embodiment, the potential difference is applied between the first electrode 25 and the second electrode 26 such that the first electrode 25 connected to an end on the +Z side of the thermoelectric semiconductor element 24 absorbs heat, and the second electrode 26 connected to an end on the −Z side of the thermoelectric semiconductor element 24 generates heat. The substrate W supported by the support surface 4A is cooled by the heat absorption of the first electrode 25. Note that the potential difference may be applied between the first electrode 25 and the second electrode 26 such that the first electrode 25 generates heat and the second electrode 26 absorbs heat. As the first electrode 25 generates heat, the substrate W supported by the support surface 4A is heated.

The first insulating film 21 of the thermoelectric module plate 6 is adjacent to the support portion 41 of the top plate 4. A viscoelastic film 12 is provided between the support portion 41 of the top plate 4 and the first insulating film 21 of the thermoelectric module plate 6. The viscoelastic film 12 contains heat conductive grease. The viscoelastic film 12 may include a gel sheet. As the first electrode 25 absorbs heat, the heat of the substrate W supported by the support surface 4A is transferred to the heat exchange plate 7 via the support portion 41, the viscoelastic film 12, and the thermoelectric module plate 6.

The second insulating film 22 is joined to the heat exchange plate 7. The second insulating film 22 is joined to the heat exchange plate 7 by, for example, an adhesive.

First Coupling Member

Figure 6:
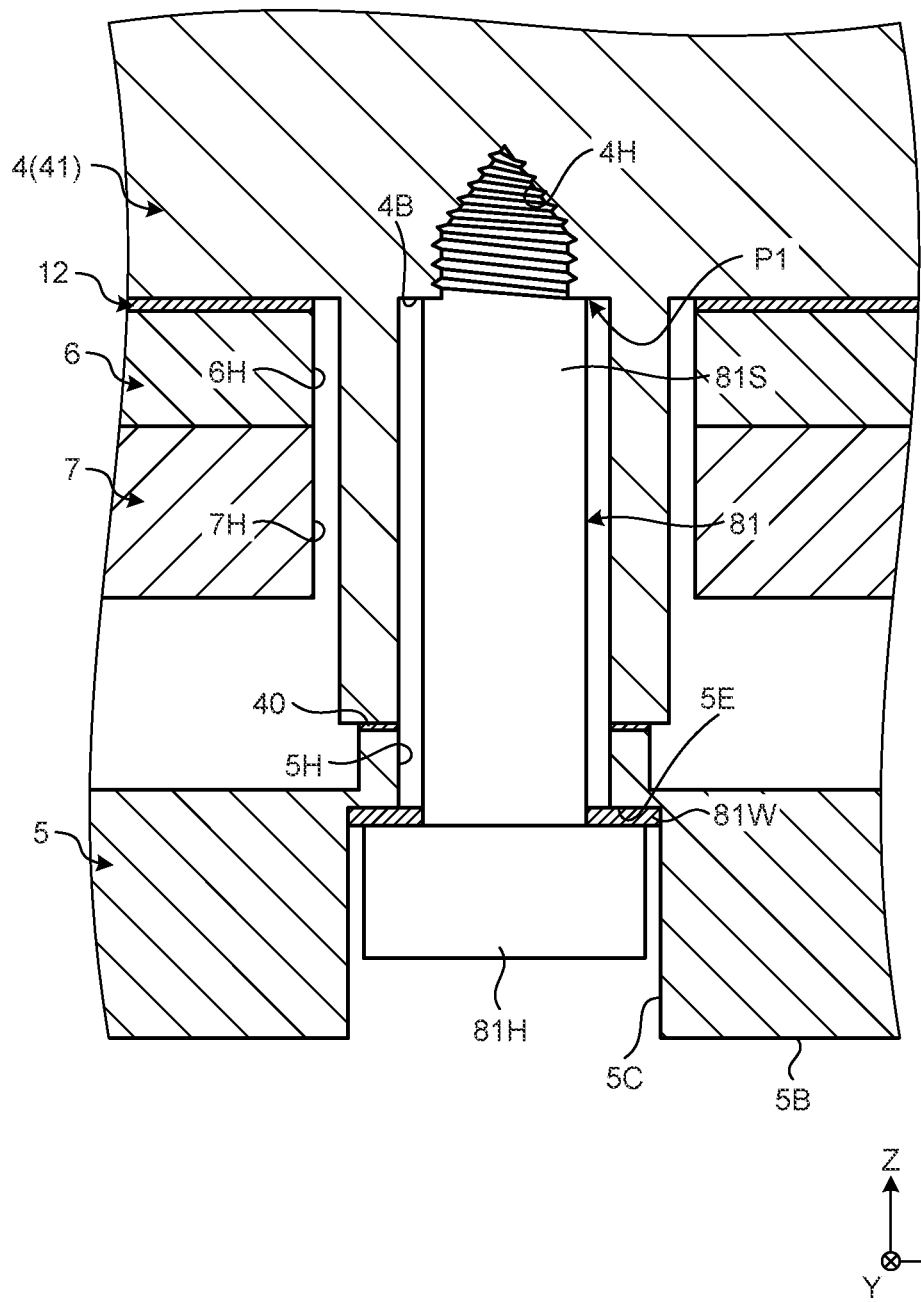
FIG. 6 is a cross-sectional view illustrating an example of a first coupling member according to the present embodiment.

FIG. 6 is a cross-sectional view illustrating an example of the first coupling member 81 according to the present embodiment. The first coupling member 81 couples the top plate 4 and the base plate 5 via the thermoelectric module plate 6 and the heat exchange plate 7. The first coupling member 81 couples the first part P1 of the top plate 4 and the base plate 5 through the through hole 6H of the thermoelectric module plate 6 and the through hole 7H of the heat exchange plate 7. The first part P1 is defined in a central part of the support portion 41 of the top plate 4 in the XY plane. The first coupling member 81 is fixed to the central part of the top plate 4. The first coupling member 81 is fixed to each of the top plate 4 and the base plate 5.

The first coupling member 81 includes a bolt. The first coupling member 81 has a head portion 81H, a shaft portion 81S, and a washer 81W. A screw thread is provided at a distal end (upper end) of the shaft portion 81S. The screw hole 4H into which the distal end of the shaft portion 81S is inserted is formed in the back surface 4B of the first part P1 of the support portion 41. A screw groove is provided in the screw hole 4H. As the screw thread provided on the shaft portion 81S and the screw groove provided on the screw hole 4H are engaged with each other, the first coupling member 81 is fixed to the top plate 4.

At least a part of the shaft portion 81S is arranged in the through hole 5H of the base plate 5. A surface of the shaft portion 81S and an inner surface of the through hole 5H are separated from each other. At least a part of the shaft portion 81S is arranged in the through hole 7H of the heat exchange plate 7. The surface of the shaft portion 81S and an inner surface of the through hole 7H are separated from each other. At least a part of the shaft portion 81S is arranged in the through hole 6H of the thermoelectric module plate 6. The surface of the shaft portion 81S and an inner surface of the through hole 6H are separated from each other. Note that the surface of the shaft portion 81S may come into contact with at least one of the inner surface of the through hole 5H, the inner surface of the through hole 7H, and the inner surface of the through hole 6H.

The head portion 81H is arranged in the concave portion 5C provided on the lower surface 5B of the base plate 5. An inner diameter of the concave portion 5C is larger than an inner diameter of the through hole 5H. A support surface 5E is arranged at a boundary between the through hole 5H and the concave portion 5C. The support surface 5E faces the −Z direction. The washer 81W is arranged between the head portion 81H and the support surface 5E. The washer 81W is arranged around the shaft portion 81S.

As the distal end of the shaft portion 81S is screwed into the screw hole 4H, the head portion 81H is pressed against the support surface 5E via the washer 81W. As a result, the first coupling member 81 is fixed to the base plate 5.

As the first coupling member 81 is fixed to each of the top plate 4 and the base plate 5, relative positions of the first coupling member 81, the top plate 4, and the base plate 5 are maintained.

Second Coupling Member

Figure 7:
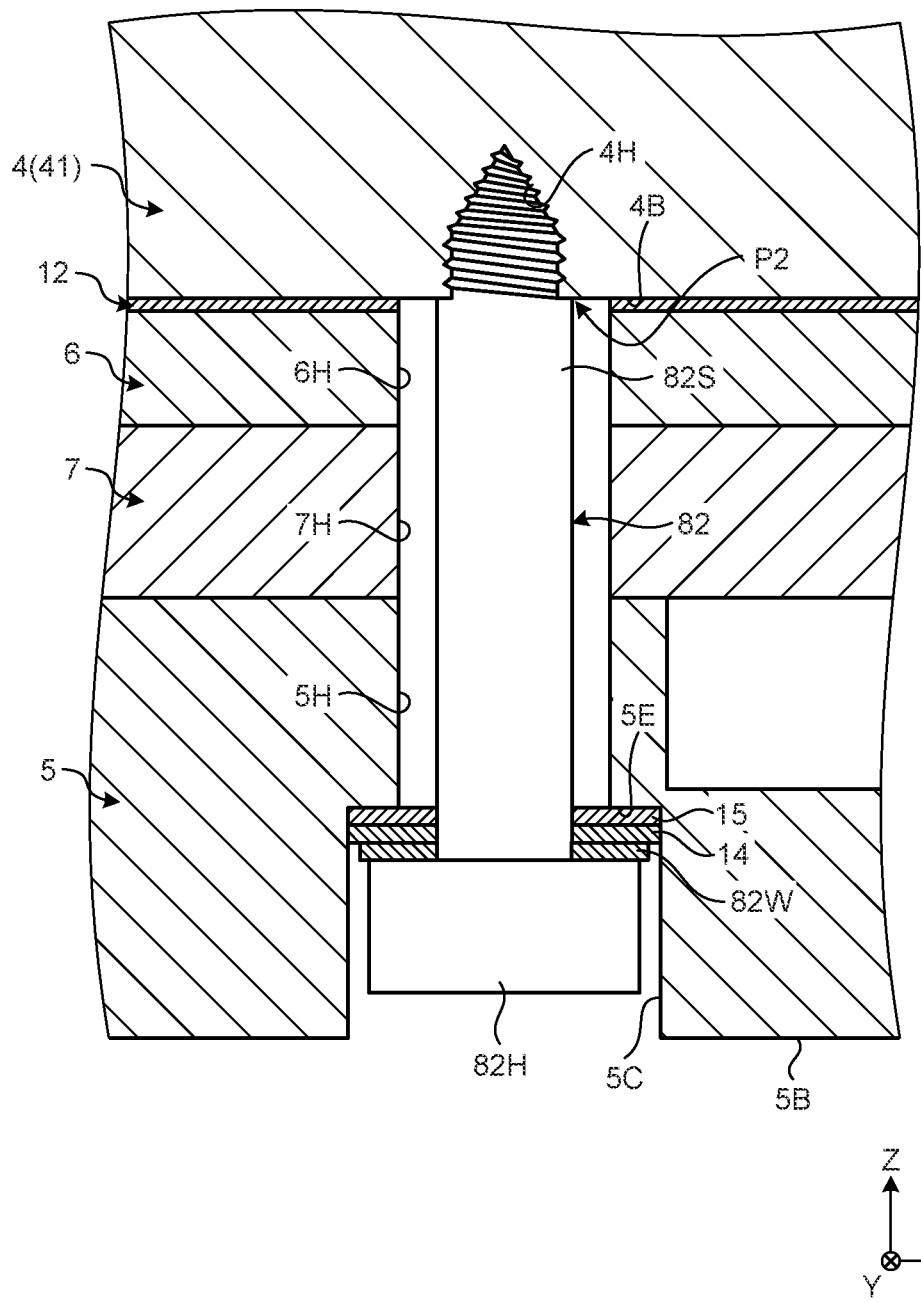
FIG. 7 is a cross-sectional view illustrating an example of a second coupling member according to the present embodiment.

FIG. 7 is a cross-sectional view illustrating an example of the second coupling member 82 according to the present embodiment. The second coupling member 82 couples the top plate 4 and the base plate 5 via the thermoelectric module plate 6 and the heat exchange plate 7. The second coupling member 82 couples the second part P2 of the top plate 4 and the base plate 5 through the through hole 6H of the thermoelectric module plate 6 and the through hole 7H of the heat exchange plate 7. A plurality of the second parts P2 are defined around the first part P1 defined by the support portion 41 of the top plate 4 in the XY plane. A plurality of the second coupling members 82 are fixed around the first coupling member 81. The second coupling member 82 is fixed to the top plate 4 and can move relative to the base plate 5.

The second coupling member 82 includes a bolt. The second coupling member 82 has a head portion 82H, a shaft portion 82S, and a washer 82W. A screw thread is provided at a distal end (upper end) of the shaft portion 82S. The screw hole 4H into which the distal end of the shaft portion 82S is inserted is formed in the back surface 4B of the second part P2 of the support portion 41. A screw groove is provided in the screw hole 4H. As the screw thread provided on the shaft portion 82S and the screw groove provided on the screw hole 4H are engaged with each other, the second coupling member 82 is fixed to the top plate 4.

At least a part of the shaft portion 82S is arranged in the through hole 5H of the base plate 5. The surface of the shaft portion 82S and an inner surface of the through hole 5H are separated from each other. At least a part of the shaft portion 82S is arranged in the through hole 7H of the heat exchange plate 7. The surface of the shaft portion 82S and an inner surface of the through hole 7H are separated from each other. At least a part of the shaft portion 82S is arranged in the through hole 6H of the thermoelectric module plate 6. The surface of the shaft portion 82S and an inner surface of the through hole 6H are separated from each other.

The head portion 82H is arranged in the concave portion 5C provided on the lower surface 5B of the base plate 5. An inner diameter of the concave portion 5C is larger than an inner diameter of the through hole 5H. A support surface 5E is arranged at a boundary between the through hole 5H and the concave portion 5C. The support surface 5E faces the −Z direction.

The washer 82W is arranged on the +Z side of the head portion 82H. The washer 82W is arranged around the shaft portion 82S. The washer 82W is fixed to the head portion 82H.

In the present embodiment, the temperature control device 3 includes a sliding member 14 arranged between the second coupling member 82 and the base plate 5. The sliding member 14 includes a washer arranged between the head portion 82H and the support surface 5E. The sliding member 14 is arranged around the shaft portion 82S. The sliding member 14 is arranged on the +Z side of the washer 82W of the second coupling member 82.

A washer 15 is arranged between the sliding member 14 and the support surface 5E. The washer 15 is arranged on the +Z side of the sliding member 14. The washer 15 is arranged in the concave portion 5C such that an upper surface of the washer 15 comes into contact with the support surface 5E. An outer diameter of the washer 15 is substantially equal to the inner diameter of the concave portion 5C. The washer 15 fits into the concave portion 5C. A position of the washer 15 is fixed in the concave portion 5C. Relative positions of the washer 15 and the base plate 5 are maintained.

In the present embodiment, the base plate 5 includes the washer 15. That is, the washer 15 is regarded as a component of the base plate 5. The base plate 5 and the washer 15 are regarded as an integrated body.

The sliding member 14 is arranged between the washer 82W of the second coupling member 82 and the washer 15 of the base plate 5. An upper surface of the washer 82W and a lower surface of the sliding member 14 face each other. The upper surface of the washer 82W and the lower surface of the sliding member 14 come into contact with each other. An upper surface of the sliding member 14 and a lower surface of the washer 15 face each other. The upper surface of the sliding member 14 and the lower surface of the washer 15 come into contact with each other.

The sliding member 14 is arranged in the concave portion 5C such that the upper surface of the sliding member 14 comes into contact with the lower surface of the washer 15. An outer diameter of the sliding member 14 is substantially equal to the inner diameter of the concave portion 5C. The sliding member 14 fits into the concave portion 5C. A position of the sliding member 14 is fixed in the concave portion 5C. Relative positions of the sliding member 14 and the base plate 5 are maintained.

The washer 82W is arranged in the concave portion 5C such that the upper surface of the washer 82W comes into contact with the lower surface of the sliding member 14. Each of an outer diameter of the washer 82W and an outer diameter of the head portion 82H is smaller than the inner diameter of the concave portion 5C.

A coefficient of friction of a surface of the sliding member 14 with respect to the second coupling member 82 is smaller than a coefficient of friction of a surface of the base plate 5 with respect to the second coupling member 82. In the present embodiment, a coefficient of friction of the surface of the sliding member 14 with respect to the washer 82W is smaller than a coefficient of friction of a surface of the washer 15. In the present embodiment, each of the washer 82W and the washer 15 is made of stainless steel. The sliding member 14 is made of polyetheretherketone resin (PEEK). The washer 82W of the second coupling member 82 can slide against the lower surface of the sliding member 14.

As the distal end of the shaft portion 82S is screwed into the screw hole 4H, the head portion 82H and the washer 82W are pressed against the support surface 5E via the sliding member 14 and the washer 15. The washer 82W can slide against the lower surface of the sliding member 14. The head portion 82H and the washer 82W are fixed and integrated. Each of an outer diameter of the washer 82W and an outer diameter of the head portion 82H is smaller than the inner diameter of the concave portion 5C. Therefore, the head portion 82H and the washer 82W can move in the XY plane while sliding against the lower surface of the sliding member 14 inside the concave portion 5C.

The head portion 82H, the shaft portion 82S, and the washer 82W are integrated. Therefore, the second coupling member 82 can move in the XY plane while sliding against the lower surface of the sliding member 14.

As the second coupling member 82 is fixed to the top plate 4, the relative positions of the second coupling member 82 and the top plate 4 are maintained. The second coupling member 82 slides on the sliding member 14, thereby moving relative to the base plate 5 in the XY plane. The relative positions of the second coupling member 82 and the base plate 5 change in the XY plane orthogonal to the central axis of the second coupling member 82.

Convex Portion

Figure 8:
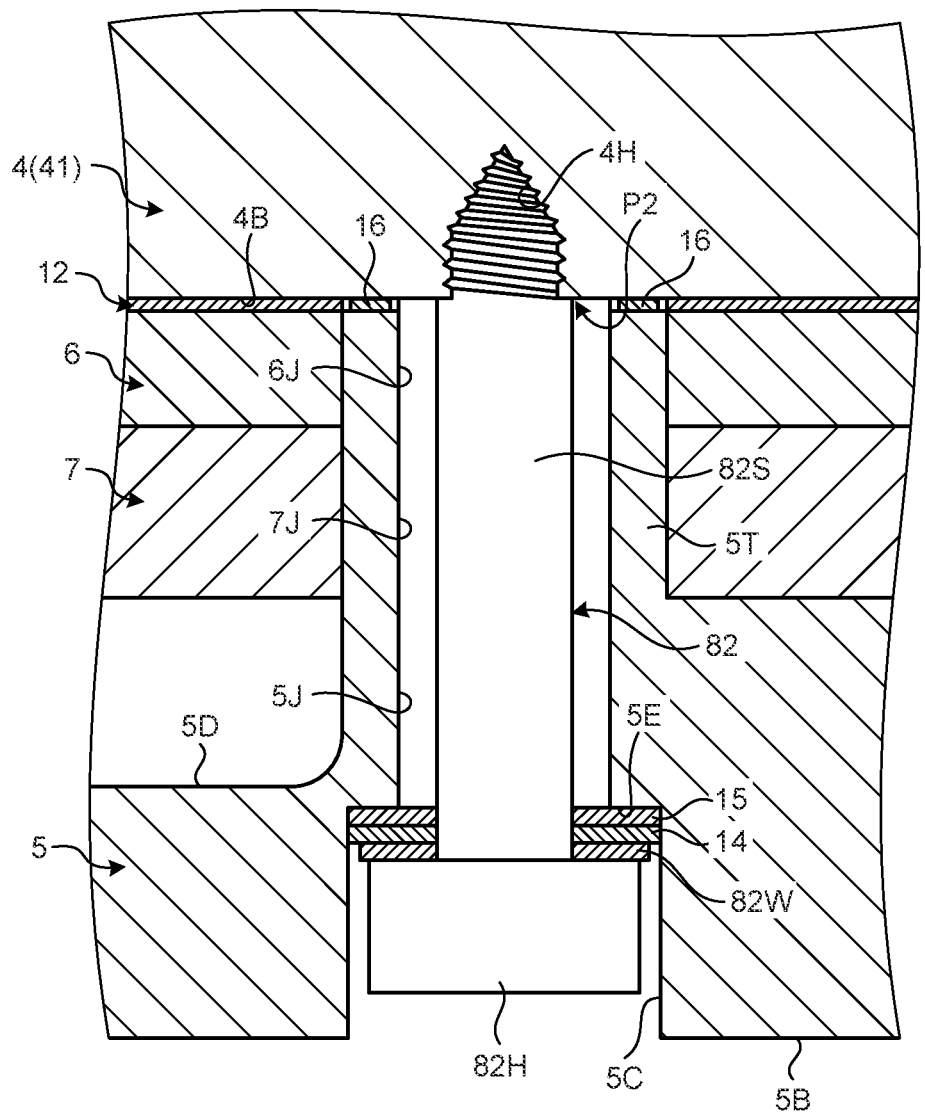
FIG. 8 is a cross-sectional view illustrating an example of a convex portion according to the present embodiment.

FIG. 8 is a cross-sectional view illustrating an example of the convex portion 5T according to the present embodiment. The base plate 5 has a convex portion 5T protruding from the opposing surface 5D to the support portion 41. At least a part of the convex portion 5T is arranged in a through hole 7J provided in the heat exchange plate 7. At least a part of the convex portion 5T is arranged in a through hole 6J provided in the thermoelectric module plate 6. An upper end of the convex portion 5T is connected to the support portion 41 of the top plate 4. Among the plurality of second coupling members 82, at least one second coupling member 82 is arranged in a through hole 5J provided in the convex portion 5T.

Since the convex portion 5T is connected to the support portion 41, a distance between the back surface 4B of the support portion 41 and each of the upper surface 5A and the opposing surface 5D of the base plate 5 is maintained in the Z-axis direction.

In the present embodiment, a spacer 16 is arranged between an upper end surface of the convex portion 5T and the back surface 4B of the support portion 41. An upper end of the convex portion 5T is connected to the support portion 41 via the spacer 16. As the thickness of the spacer 16 or the number of the spacers 16 is adjusted, the distance between the back surface 4B of the support portion 41 and each of the upper surface 5A and the opposing surface 5D of the base plate 5 is adjusted.

The spacer 16 is formed using a material having low thermal conductivity such as carbon. As a result, the heat of the substrate W is suppressed from being directly transferred to the base plate 5. The heat of the substrate W is efficiently transferred to the thermoelectric module plate 6.

Operation

Next, an operation of the temperature control device 3 according to the present embodiment will be described. The internal space 2S of the chamber device 2 is depressurized. The substrate W is carried into the internal space 2S of the chamber device 2. The lift pin 9 ascends such that an upper end of the lift pin 9 is arranged above the support surface 4A. The lift pin 9 supports the back surface of the substrate W conveyed to the internal space 2S. The lift pin 9 that supports the back surface of the substrate W descends. As the lift pin 9 descends, the substrate W is supported by the support surface 4A of the top plate 4.

When a potential difference is applied to the thermoelectric module 20, the temperature control device 3 starts adjusting the temperature of the substrate W supported by the support surface 4A. In the present embodiment, the thermoelectric module plate 6 includes the first to seventh thermoelectric module plates 61 to 67. The temperature of the substrate W can be adjusted separately by each of the first to seventh thermoelectric module plates 61 to 67. As a potential difference applied to each of the first to seventh thermoelectric module plates 61 to 67 is adjusted, the temperature control device 3 can adjust the temperature distribution of the substrate W.

An etching gas is supplied to the internal space 2S of the chamber device 2. The chamber member 2T is heated by the temperature adjustment device 2U. As the chamber member 2T is heated, it is possible to suppress foreign matter generated by an etching process from adhering to an inner surface of the chamber member 2T.

When the chamber member 2T is heated, there is a possibility that the temperature of the substrate W supported by the support surface 4A of the temperature control device 3 becomes excessively higher than a target temperature, or the temperature distribution of the substrate W does not reach a target temperature distribution. The temperature control device 3 adjusts the temperature of the substrate W such that the substrate W reaches the target temperature even when the chamber member 2T is heated. In addition, the temperature control device 3 adjusts the temperature distribution of the substrate W such that the substrate W has the target temperature distribution even when the chamber member 2T is heated.

At least a part of the temperature control device 3 is highly likely to be thermally deformed by radiant heat of the chamber member 2T. Since the top plate 4 is a plate-shaped member, the amount of thermal deformation of the top plate 4 in the XY plane is larger than the amount of thermal deformation of the top plate 4 in the Z-axis direction. Similarly, the amount of thermal deformation of the thermoelectric module plate 6 in the XY plane is larger than the amount of thermal deformation of the thermoelectric module plate 6 in the Z-axis direction. In addition, a coefficient of linear expansion of the top plate 4 is different from a coefficient of linear expansion of the thermoelectric module plate 6. Therefore, the amount of thermal deformation of the top plate 4 and the amount of thermal deformation of the thermoelectric module plate 6 are highly likely to be different. A difference between the amount of thermal deformation of the top plate 4 and the amount of thermal deformation of the thermoelectric module plate 6 in the XY plane is highly likely to be large.

Figure 9:
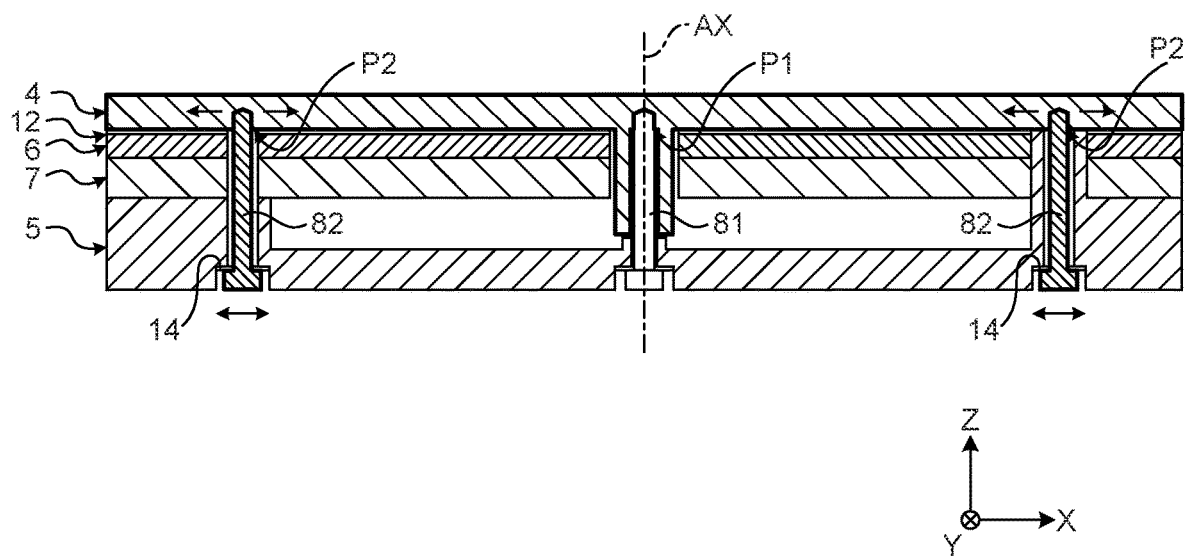
FIG. 9 is a schematic view for describing an effect according to the present embodiment.

FIG. 9 is a schematic view for describing an effect according to the present embodiment. In the present embodiment, the second coupling member 82 can move relative to the base plate 5 in the XY plane in the state where the distal end of the second coupling member 82 is fixed to the top plate 4. Therefore, when the top plate 4 is thermally deformed in the XY plane, the second coupling member 82 can move in the XY plane so as to be interlocked with the thermal deformation of the top plate 4. As a result, it is possible to suppress excessive stress from acting on the top plate 4 or excessive stress from acting on the thermoelectric module plate 6.

The viscoelastic film 12 is provided between the top plate 4 and the thermoelectric module plate 6. Therefore, the top plate 4 can smoothly move relative to the thermoelectric module plate 6 in the XY plane. As a result, even if the difference between the amount of thermal deformation of the top plate 4 and the amount of thermal deformation of the thermoelectric module plate 6 is large, the excessive stress acting on the top plate 4 or the excessive stress acting on the thermoelectric module plate 6 is suppressed.

The viscoelastic film 12 contains heat conductive grease. Therefore, the heat of the substrate W can be transferred to the thermoelectric module plate 6 via the heat conductive grease.

The sliding member 14 is arranged between the second coupling member 82 and the base plate 5. As a result, the second coupling member 82 can smoothly move relative to the base plate 5 while sliding on the sliding member 14.

The first coupling member 81 is fixed to each of the top plate 4 and the base plate 5. Therefore, the relative positions of the top plate 4 and the base plate 5 are fixed by the first coupling member 81.

The top plate 4 is highly likely to be thermally deformed in the radial direction with the central axis AX as the reference. In the present embodiment, the first part P1 of the top plate 4 to which the distal end of the first coupling member 81 is fixed is defined as the central part of the top plate 4. The plurality of second parts P2 of the top plate 4 to which the distal end of the second coupling member 82 interlocked with the thermal deformation of the top plate 4 is fixed are defined around the first part P1. Therefore, the excessive stress is suppressed from acting on each of the top plate 4 and the thermoelectric module plate 6.

The convex portion 5T is directly connected to the top plate 4. As a result, the relative distance between the top plate 4 and the base plate 5 in the Z-axis direction is maintained even if the top plate 4 is thermally deformed in the XY plane or the viscoelastic film 12 is crushed or expanded.

After the etching process is completed, the lift pin 9 ascends. The lift pin 9 ascends in the state of supporting the back surface of the substrate W. As a result, the back surface of the substrate W and the support surface 4A of the top plate 4 are separated from each other. The substrate W separated from the top plate 4 is carried out from the chamber device 2 by an unloading device (not illustrated).

Effect

As described above, the first coupling member 81 couples the first part P1 of the top plate 4 and the base plate 5 via the thermoelectric module plate 6 and the heat exchange plate 7 according to the present embodiment. The second coupling member 82 couples the second part P2 of the top plate 4, different from the first part P1, and the base plate 5 via the thermoelectric module plate 6 and the heat exchange plate 7. Since the first coupling member 81 is fixed to each of the top plate 4 and the base plate 5, the relative positions of the top plate 4 and the base plate 5 are fixed by the first coupling member 81. Since the second coupling member 82 is fixed to the top plate 4 and can move relative to the base plate 5, the second coupling member 82 can be interlocked with the thermal deformation of the top plate 4 when the top plate 4 is thermally deformed. As a result, it is possible to suppress excessive stress from acting on the top plate 4 or excessive stress from acting on the thermoelectric module plate 6. Therefore, damage to the temperature control device 3 is suppressed, and deterioration of the performance of the temperature control device 3 is suppressed.

The viscoelastic film 12 is provided between the top plate 4 and the thermoelectric module plate 6. Therefore, the top plate 4 can smoothly move relative to the thermoelectric module plate 6 in the XY plane. As a result, even if the difference between the amount of thermal deformation of the top plate 4 and the amount of thermal deformation of the thermoelectric module plate 6 is large, the excessive stress acting on the top plate 4 or the excessive stress acting on the thermoelectric module plate 6 is suppressed.

The viscoelastic film 12 contains heat conductive grease. Therefore, the heat of the substrate W can be transferred to the thermoelectric module plate 6 via the heat conductive grease.

The sliding member 14 is arranged between the second coupling member 82 and the base plate 5. As a result, the second coupling member 82 can smoothly move relative to the base plate 5 while sliding on the sliding member 14.

The sliding member 14 includes a washer arranged around the shaft portion 82S of the second coupling member 82. As a result, the second coupling member 82 can slide smoothly against the sliding member 14.

The top plate 4 is highly likely to be thermally deformed in the radial direction with the central axis AX as the reference. The first part P1 of the top plate 4 to which the distal end of the first coupling member 81 is fixed is defined as the central part of the top plate 4. The plurality of second parts P2 of the top plate 4 to which the distal end of the second coupling member 82 interlocked with the thermal deformation of the top plate 4 is fixed are defined around the first part P1. Therefore, the excessive stress is suppressed from acting on each of the top plate 4 and the thermoelectric module plate 6.

The convex portion 5T is directly connected to the top plate 4. As a result, the relative distance between the top plate 4 and the base plate 5 in the Z-axis direction is maintained even if the top plate 4 is thermally deformed in the XY plane or the viscoelastic film 12 is crushed or expanded.

The invention claimed is:

1. A temperature control device comprising:
a top plate configured to support a substrate;
a base plate that is connected to the top plate and defines an internal space with the top plate;
a thermoelectric module plate arranged in the internal space;
a heat exchange plate that is arranged in the internal space and configured to exchange heat with the thermoelectric module plate;
a first coupling member that couples the top plate and the base plate via the thermoelectric module plate and the heat exchange plate, the first coupling member having a first end that is configured to be fixed to the top plate and a second end that is configured to be fixed to the base plate; and
a second coupling member that couples the top plate and the base plate via the thermoelectric module plate and the heat exchange plate, the second coupling member having a first end that is configured to be fixed to the top plate; and
a sliding member arranged between the second coupling member and the base plate,
wherein the second coupling member has a second end that is configured, based on the first end of the second coupling member being fixed to the top plate, to move relative to the sliding member along a surface of the sliding member such that the second coupling member moves relative to the base plate,
wherein the base plate defines a concave portion that is recessed upward from a bottom surface of the base plate toward the top plate and accommodates a head portion of the second coupling member, the head portion defining the second end of the second coupling member,
wherein the temperature control device further comprises a first washer disposed between the sliding member and an upper surface of the concave portion, and
wherein an outer circumferential surface of the first washer and an outer circumferential surface of the sliding member are in contact with an inner circumferential surface of the concave portion in a radial direction.

2. The temperature control device according to claim 1, further comprising
a viscoelastic film provided between the top plate and the thermoelectric module plate,
the thermoelectric module plate being arranged so as to be adjacent to the top plate in the internal space.

3. The temperature control device according to claim 2, wherein the viscoelastic film contains heat conductive grease.

4. The temperature control device according to claim 1, wherein the second coupling member includes a bolt, and the sliding member includes a washer arranged around the bolt.

5. The temperature control device according to claim 1, wherein a coefficient of friction of the sliding member with respect to the second coupling member is smaller than a coefficient of friction of the base plate with respect to the second coupling member.

6. The temperature control device according to claim 1, wherein the first coupling member is fixed to a central part of the top plate, and a plurality of the second coupling members are fixed around the first coupling member.

7. The temperature control device according to claim 1, wherein a lower surface of the head portion of the second coupling member is disposed above relative to the bottom surface of the base plate toward the top plate.

8. The temperature control device according to claim 1, wherein an outer circumferential surface of the head portion of the second coupling member is spaced apart from the inner circumferential surface of the concave portion in the radial direction.

9. The temperature control device according to claim 1, further comprising a pair of washers that are disposed between the base plate and the second end of the second coupling member, the pair of washers including the first washer,
wherein the sliding member is disposed between the pair of washers, and
wherein one of the pair of washers in contact with the second coupling member is configured to move relative to the sliding member along the surface of the sliding member.

10. The temperature control device according to claim 1, further comprising
a second washer disposed between the sliding member and the head portion of the second coupling member.

11. The temperature control device according to claim 10, wherein an outer circumferential surface of the head portion of the second coupling member and an outer circumferential surface of the second washer are spaced apart from the inner circumferential surface of the concave portion in the radial direction.

12. The temperature control device according to claim 10, wherein a coefficient of friction of the sliding member with respect to the first washer is smaller than a coefficient of friction of a surface of the second washer.

13. The temperature control device according to claim 1, wherein the second coupling member includes the head portion and a shaft portion, the shaft portion having a non-threaded part that is adjacent to the head portion and a threaded part at a distal end of the shaft portion that is configured to be screwed into the top plate.

14. The temperature control device according to claim 13, wherein the threaded part of the second coupling member is configured to penetrate a back surface of the top plate that faces the base plate, and the non-threaded part of the second coupling member is configured to abut the back surface of the top plate.

* * * * *